United States Patent
Hemgesberg et al.

(10) Patent No.: US 10,450,199 B2
(45) Date of Patent: Oct. 22, 2019

(54) NANOPARTICLES FOR THE USE AS PINNING CENTERS IN SUPERCONDUCTORS

(71) Applicant: BASF SE, Ludwigshafen (DE)

(72) Inventors: Maximilian Hemgesberg, Kaiserslautern (DE); Denis Schwall, Ludwigshafen (DE); Thorsten Martin Staudt, San Francisco, CA (US); Isabel van Driessche, Waasmunster (BE); Katrien De Keukeleere, Zaffelare (BE); Jonathan De Roo, Ghent (BE); Till Gruendling, Mannheim (DE); Matthias Maier, Sandhausen (DE); Michael Baecker, Cologne (DE); Jan Bennewitz, Sankt Augustin (DE); Ron Feenstra, Bonn (DE); Hannes Rijckaert, Zomergem (BE); Hens Zeger, Ghent (BE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/554,742

(22) PCT Filed: Feb. 24, 2016

(86) PCT No.: PCT/EP2016/053862
§ 371 (c)(1),
(2) Date: Aug. 31, 2017

(87) PCT Pub. No.: WO2016/139101
PCT Pub. Date: Sep. 9, 2016

(65) Prior Publication Data
US 2018/0044197 A1  Feb. 15, 2018

(30) Foreign Application Priority Data
Mar. 2, 2015 (EP) .................................. 15157156

(51) Int. Cl.
*C01G 1/02* (2006.01)
*C01G 23/047* (2006.01)
(Continued)

(52) U.S. Cl.
CPC ............. *C01G 1/02* (2013.01); *C01G 23/047* (2013.01); *C01G 25/02* (2013.01); *C01G 27/02* (2013.01);
(Continued)

(58) Field of Classification Search
CPC .......... C01G 1/02; C01G 35/00; C01G 27/02; C01G 25/02; C09C 3/08; H01L 39/2483;
(Continued)

(56) References Cited

U.S. PATENT DOCUMENTS

| 5,593,781 A * | 1/1997 | Nass ...................... B82Y 30/00 423/600 |
| 2006/0009370 A1 * | 1/2006 | Zuechner ............... B82Y 30/00 510/507 |

(Continued)

FOREIGN PATENT DOCUMENTS

| EP | 0 830 218 A1 | 3/1998 |
| EP | 1 198 846 A2 | 4/2002 |

(Continued)

OTHER PUBLICATIONS

Joo, Jin, et al. "Multigram scale synthesis and characterization of monodisperse tetragonal zirconia nanocrystals." Journal of the American Chemical Society 125.21 (2003): 6553-6557.*

(Continued)

*Primary Examiner* — Richard M Rump
(74) *Attorney, Agent, or Firm* — Oblon, McClelland, Maier & Neustadt, L.L.P.

(57) ABSTRACT

The present invention is in the field of nanoparticles, their preparation and their use as pinning centers in superconduc-
(Continued)

tors. In particular the present invention relates to nanoparticles comprising an oxide of Sr, Ba, Y, La, Ti, Zr, Hf, Nb, or Ta, wherein the nanoparticles have a weight average diameter of 1 to 30 nm and wherein an organic compound of general formula (I), (II) or (III) or an organic compound containing at least two carboxylic acid groups on the surface of the nanoparticles (I) (II) (III) wherein a is 0 to 5, b and c are independent of each other 1 to 14, n is 1 to 5, f is 0 to 5, p and q are independent of each other 1 to 14, and e and f are independent of each other 0 to 12.

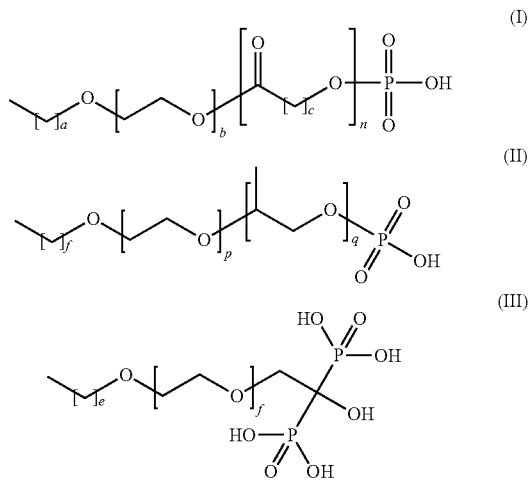

12 Claims, 1 Drawing Sheet

(51) Int. Cl.
| | |
|---|---|
| C01G 25/02 | (2006.01) |
| C01G 27/02 | (2006.01) |
| C01G 35/00 | (2006.01) |
| C09C 1/36 | (2006.01) |
| C09C 3/08 | (2006.01) |
| C09D 5/24 | (2006.01) |
| C09C 1/00 | (2006.01) |
| H01L 39/24 | (2006.01) |
| C09D 11/033 | (2014.01) |
| C09D 11/38 | (2014.01) |

(52) U.S. Cl.
CPC ............... *C01G 35/00* (2013.01); *C09C 1/00* (2013.01); *C09C 1/3669* (2013.01); *C09C 3/08* (2013.01); *C09D 5/24* (2013.01); *C09D 11/033* (2013.01); *C09D 11/38* (2013.01); *H01L 39/2425* (2013.01); *H01L 39/2483* (2013.01); *C01P 2002/60* (2013.01); *C01P 2002/72* (2013.01); *C01P 2002/74* (2013.01); *C01P 2004/52* (2013.01); *C01P 2004/64* (2013.01)

(58) Field of Classification Search
CPC ... C09D 11/38; C09D 11/033; C01P 2002/60; C01P 2004/64
See application file for complete search history.

(56) References Cited

U.S. PATENT DOCUMENTS

| | | | |
|---|---|---|---|
| 2008/0293831 A1 | 11/2008 | Kato et al. | |
| 2010/0075062 A1* | 3/2010 | Wang | B82Y 20/00 427/487 |
| 2012/0071680 A1 | 3/2012 | Tokumitsu | |

FOREIGN PATENT DOCUMENTS

| | | |
|---|---|---|
| EP | 1 208 244 A1 | 5/2002 |
| EP | 1 994 979 A1 | 11/2008 |
| EP | 2 137 330 A2 | 12/2009 |
| JP | 1-111713 A | 4/1989 |
| JP | 1989-169828 | 4/1989 |
| WO | WO 2008/058849 A1 | 5/2008 |
| WO | WO 2013/139843 A2 | 9/2013 |
| WO | WO-2015095317 A1 * | 6/2015 ............ G02B 1/005 |

OTHER PUBLICATIONS

U.S. Appl. No. 15/034,346, dated May 4, 2016, U.S. Pat. No. 2016-0343933 A1, Michael Baecker, et al.
U.S. Appl. No. 15/554,756, dated Aug. 31, 2017, Isabel Van Driessche, et al.
International Search Report and Written Opinion dated May 3, 2016 in PCT/EP2016/053862.
Jonathan De Roo, et al., "Unravelling the Surface Chemistry of Metal Oxide Nanocrystals, the Role of Acids and Bases", Journal of the American Chemical Society, vol. 136, 2014, pp. 9650-9657.
C.J.V. Oliveira, et al., "Effect of $Ta_2O_5$ addition on the texture of the Y123 Superconductor", Physica C: Superconductivity, vol. 422, 2005, pp. 83-87.

* cited by examiner

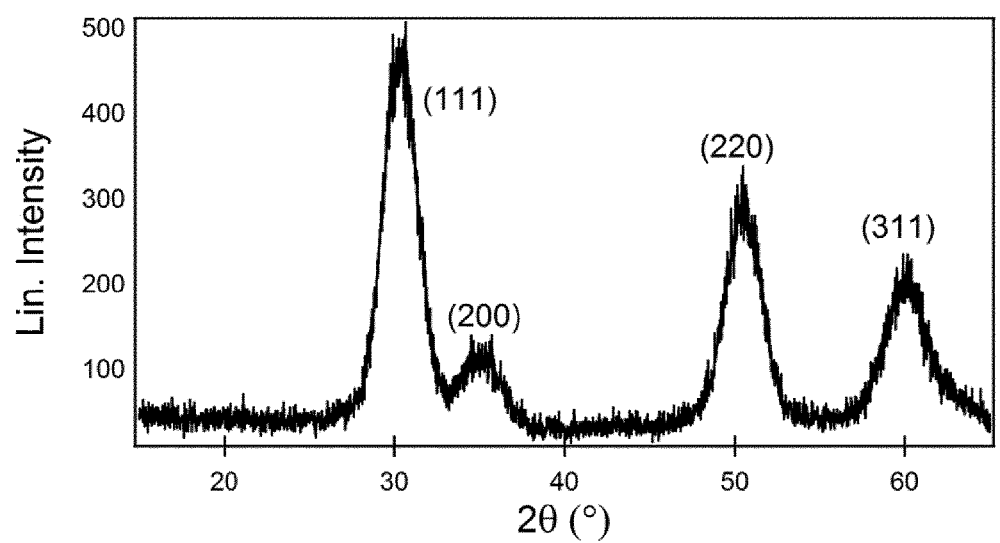

NANOPARTICLES FOR THE USE AS PINNING CENTERS IN SUPERCONDUCTORS

The present invention is in the field of nanoparticles, their preparation and their use as pinning centers in superconductors.

The applicability of superconductors, in particular high-temperature superconductors with transition temperatures of at least 77 K, often depends on their critical current density in high magnetic fields. The introduction of small particles with low conductivity, so-called pinning centers, can increase the critical current density in high magnetic fields. The use of pinning centers in superconductors is known from prior art.

WO 2013/139 843 discloses a method for making pinning centers from a W/O emulsion and their use in high-temperature superconductors.

De Roo et al. describe in the Journal of the American Chemical Society (volume 136, page 9650-9657) a method for making pinning centers in microwave-assisted solvothermal process.

WO 2008/058 849 A1 discloses $ZrO_2$ nanoparticles stabilized with ethylene methacrylate phosphate. However, no inks for superconductors are disclosed.

US 2012/0 071 680 A1 discloses surface-modified zirconia nanocrystal particles, wherein organic phosphonic acids are used as modifier. However, no particular structures of these are given and no inks for superconductors are disclosed.

It remains a challenge to prevent these nanoparticles from aggregation, particularly when the superconductor is made by chemical solution deposition. Such an aggregation leads to a decreased efficiency of the pinning centers and may even negatively affect the characteristics of the superconductor such as the critical current density. It was therefore an object of the present invention to provide nanoparticles which are stable against aggregation in inks for the preparation of superconductors as well as in the thus formed superconductor. It was desired to obtain nanoparticles which increase the critical current density at high magnetic fields of a superconductor.

These objects were achieved by nanoparticles comprising an oxide of Sr, Ba, Y, La, Ti, Zr, Hf, Nb, or Ta, wherein the nanoparticles have a weight average diameter of 1 to 30 nm and wherein an organic compound of general formula (I), (II) or (III) or an organic compound containing at least two carboxylic acid groups is on the surface of the nanoparticles

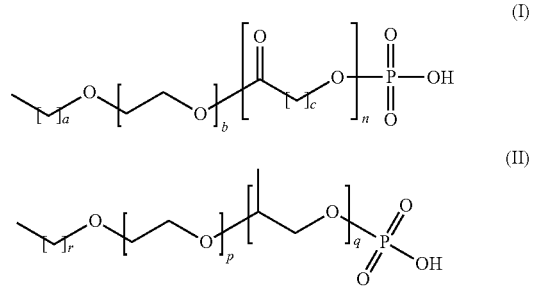

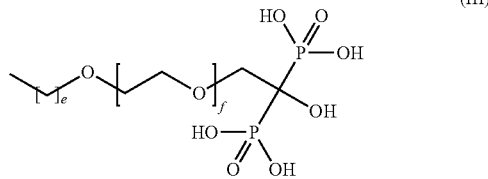

wherein a is 0 to 5,
b and c are independent of each other 1 to 14,
n is 1 to 5,
r is 0 to 5,
p and q are independent of each other 1 to 14, and
e and f are independent of each other 0 to 12.

The present invention further relates to a process for producing the nanoparticles according to the present invention comprising (i) precipitating nanoparticles comprising an oxide of Sr, Ba, Y, La, Ti, Zr, Hf, Nb, or Ta from a suspension comprising a non-polar solvent, wherein the nanoparticles have a weight average diameter of 1 to 30 nm, and (ii) adding an alcohol and an organic compound of general formula (I), (II) or (III) or an organic compound containing at least two carboxylic acid groups to the precipitated nanoparticles.

The present invention further relates to an ink for the preparation of a high temperature superconductor comprising (a) an yttrium or rare earth-containing compound,
(b) a barium-containing compound,
(c) a copper-containing compound,
(d) an alcohol, and
(e) the nanoparticles according to the present invention.

The present invention further relates to the use of the nanoparticles according to the present invention as pinning centers in superconductors.

Preferred embodiments of the present invention can be found in the description and the claims. Combinations of different embodiments fall within the scope of the present invention.

According to the present invention the nanoparticles comprise an oxide of Sr, Ba, Y, La, Ti, Zr, Hf, Nb, or Ta, preferably Sr, Ba, Ti, Zr, Hf, or Ta, in particular Zr, Hf, or Ta. Preferred examples for such oxides are SrO, $SrTiO_3$, $SrZrO_3$, BaO, $BaTiO_3$, $BaZrO_3$, $Y_2O_3$, $La_2O_3$, $TiO_2$, $ZrO_2$, $HfO_2$, $Nb_2O_5$, $Ta_2O_5$. Preferably, the nanoparticles comprise $ZrO_2$, $HfO_2$ or $Ta_2O_5$. The nanoparticles can comprise other substances, for example oxides of other metals. Preferably, the nanoparticles contain at least 90 wt.-% of the oxide of Sr, Ba, Y, La, Ti, Zr, Hf, Nb, Ta, or combinations thereof in particular at least 95 wt.-%, such as 98 wt.-%.

The nanoparticles according to the present invention have a weight average diameter of 1 to 30 nm, preferably 2 to 20 nm, in particular 4 to 10 nm. The weight average diameter is preferably measured by dynamic light scattering according to ISO 22412 (2008), preferably by using the Mie theory. The nanoparticles have a low dispersity of the particle size distribution $D_{90}/D_{50}$ measured by dynamic light scattering, preferably a $D_{90}/D_{50}$ value of 1.2 or less, more preferably 1.15 or less, in particular 1.1 or less.

The nanoparticles are preferably crystalline. Crystalline in the context of the present invention means that the degree of crystallinity of the nanoparticles is preferably at least 50%, more preferably at least 70%, in particular at least 90%. The degree of crystallinity is defined as the ratio of the weight average radius of the nanoparticles visually observed in the HR-TEM and the radius of the nanoparticles determined by evaluation of the full width at half maximum (FWHM) of the dominant peak of the X-ray diffraction pattern (XRD) using the Debye-Scherrer equation. A ratio of 1 determines a degree of crystallinity of 100%.

According to the present invention the nanoparticles have an organic compound of general formula (I), (II) or (III) or an organic compound containing at least two carboxylic acid groups on their surface. Without being bound to a theory it is believed that a carboxylic acid, a polyether, or a phosphoric acid bind to the surface of the nanoparticles and the remaining carboxylic acid or phosphoric acid create a surface charge which stabilizes the nanoparticles against aggregation.

In the compound of general formula (I) a is preferably 0. Preferably, b is 2 to 10, more preferably 3 to 8. Preferably, c is 2 to 10, more preferably 3 to 6. Preferably, n is 2 to 4. In one preferred example, a is 0, b is 6, c is 5, n is 3.

In the compound of general formula (II) p and q are preferably 2 to 12. The ratio of p to q is preferably from 20:80 to 80:20, in particular from 40:60 to 60:40.

In the compound of general formula (III) e is preferably 0. Preferably, f is 2 to 6.

As generally known to the skilled person, the indices a, b, c, e, f, n, p, q and r represent average values, which means that the compounds of general formula (I), (II), and (III) possess a certain degree of polydispersity as a result of the typical production methods.

Preferably, the organic compound containing at least two carboxylic acid groups is a compound of general formula (IV)

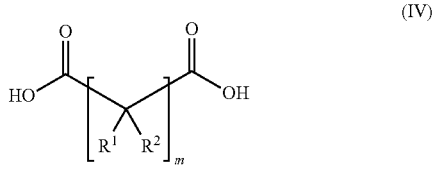

wherein $R^1$ and $R^2$ are independent of each other H, OH, or COOH, and m is 1 to 12.

If m is larger than one, it is possible that the $R^1$ and $R^2$ are all the same or different to each other. Examples for the compound of general formula (IV) include dicarboxylic acids in which $R^1$ and $R^2$ are hydrogen, such as malonic acid, succinic acid, glutaric acid, adipic acid, pimelic acid, azelaic acid, sebacic acid; dicarboxylic acids with hydroxyl groups such as tartronic acid, malic acid, tartric acid; or tricarboxylic acids such as citric acid or isocitric acid.

Preferably the organic compound of general formula (I), (II) or (III) or the organic compound containing at least two carboxylic acid groups is at least partially deprotonated. The degree of neutralization is preferably 2 to 98 mol-%, more preferably 50 to 75 mol-%, in particular 75 to 90 mol-%, wherein mol-% refers to the total moles of phosphoric acid or carboxylic acid groups. The counter ion of the deprotonated groups is preferably an ammonium ion. These include the ammonium ion, primary ammonium ions, secondary ammonium ions, tertiary ammonium ions or quaternary ammonium ions, tertiary ammonium ions are preferred. The ammonium ions preferably bear n-alkyl, n-alkylol or poly(alkylenoxy) groups. A preferred example is N,N-dibutylammoniumethanol. Alternatively, the ammonium ion can be part of a polymer such as poly(ethylene imine). An example is poly(ethylene imine) containing ester groups such as 2-ethylhexyl esters which are often obtained by reaction of poly(ethylene imine) with respective acrylic acid esters.

Preferably, the nanoparticles have trialkyl phosphorous oxide or a fatty acid in addition to the organic compound containing at least one phosphoric acid group and at least one ester group or at least two carboxylic acid groups on their surface. Examples for fatty acids include stearic acid, palmitic acid, erucic acid, oleic acid, linoleic acid, linolenic acid, or lauric acid. Oleic acid or lauric acid is preferred.

The present invention also relates to a process for producing the nanoparticles according to the present invention. This process includes precipitating nanoparticles comprising an oxide of Sr, Ba, Y, La, Ti, Zr, Hf, Nb, or Ta from a suspension comprising a non-polar solvent. Precipitation can be performed by adding a highly-polar solvent which is miscible with the non-polar solvent. Examples are ketones such as acetone, methylethylketone or cyclopentanone; alcohols such as methanol or ethanol; or nitriles such as acetonitrile.

After precipitation, the nanoparticles are separated from the solvent, for example by sedimentation, centrifugation or filtration. Centrifugation is preferred. After removal of the solvents, the particles are preferably washed with the solvent with which precipitation is effected, for example one to five times and the solvent removed.

The process according to the present invention further comprises adding an alcohol and an organic compound of general formula (I), (II) or (III) or the organic compound containing at least two carboxylic acid groups to the precipitated nanoparticles. It is either possible to first mix the alcohol with the organic compound and to add this mixture to the precipitated particles or to add the alcohol to the precipitated particles and to add the organic compound to this mixture.

Alcohols include linear alcohols such as methanol, ethanol, n-propanol, n-butanol, n-pentanol, n-hexanol, n-heptanol, n-octanol, n-nonanol, n-decanol, n-undecanol, n-dodecanol; branched alcohols such as iso-propanol, sec-butanol, tert-butanol, 2-ethylhexanol; or dialcohols such as ethylene glycol or propylene glycol. Linear alcohols are preferred, in particular methanol. The process can either contain one alcohol or a mixture of different alcohols. A preferred example for a mixture of alcohols is methanol which contains small amounts of a mixture of $C_2$-$C_{12}$ alcohols.

Typically, the weight ratio of the organic compound of general formula (I), (II) or (III) or the organic compound containing at least two carboxylic acid groups to the nanoparticles is between 1:5 to 10:1, preferably 1:1 to 1:6, such as 1:2 to 1:4. The concentration of the nanoparticles in the alcohol is usually 0.01 to 0.5 mol/l, preferably 0.05 to 0.3 mol/l, wherein the mol corresponds to the molar amount of metal ions in the nanoparticles.

Mixing the nanoparticles with the alcohol and the organic compound can be effected for example by stirring, shaking or by ultrasound.

Preferably, the suspension comprising a non-polar solvent and nanoparticles is produced by a condensation, esterification, or elimination reaction comprising a soluble precursor in the presence of a surfactant. Soluble precursors include metal halogenates, such as chlorides, bromides, iodids; or alkoxylates such as methoxylate, ethoxylate, iso-propanolate, butanolate, or hexanolat. Non-polar solvents preferably have a dipolar momentum of 1.65 D (Debye) or less, more preferably 1.6 D or less, in particular 1.5 D or less. Non-polar solvents include hydrocarbons such as hexane, cyclohexane, iso-undecane, dodecane; aromatic hydrocarbons such as benzene, toluene, ethylbenzene, xylene, mesitylene; or halogenated solvents such as chloroform. Suitable surfactants include fatty acids such as oleic acid, and phosphor oxides such as trioctyl phosphor oxide.

Alternatively, the nanoparticles according to the present invention can be made by a process comprising (i) adding an alcohol and an organic compound of general formula (I), (II) or (III) or an organic compound containing at least two carboxylic acid groups to a suspension comprising a non-polar solvent and nanoparticles comprising an oxide of Sr, Ba, Y, La, Ti, Zr, Hf, Nb, or Ta, wherein the nanoparticles have a weight average diameter of 1 to 30 nm, and (ii) removing the non-polar solvent by evaporation, wherein the alcohol has a higher boiling point than the non-polar solvent.

The same definitions and preferred embodiments as described above apply where applicable.

The nanoparticles according to the present invention are particularly stable against aggregation in inks for the preparation of high temperature superconductors. Therefore, the present invention further relates to an ink for the preparation of a high temperature superconductor comprising
  (a) an yttrium or rare earth-containing compound,
  (b) a alkaline earth metal-containing compound,
  (c) a transition metal-containing compound,
  (d) an alcohol, and
  (e) the nanoparticles according to the invention.

The yttrium- or rare earth metal-containing compound, the alkaline earth metal-containing compound and the transition metal-containing compound include oxides, hydroxides, halogenides, carboxylates, alkoxylates, nitrates or sulfates. Carboxylates are preferred, in particular acetate or propionate. Carboxylates and alkoxylates can be substituted, preferably by fluorine, such as difluoroacetate, trifluoroacetate, or partially or fully fluorinated propionate.

At least one of the rare earth metal or yttrium containing compound, the alkaline earth metal containing compound and the transition metal containing compound contains fluorine. Preferably, the alkaline earth metal containing compound contains fluorine, for example as trifluoroacetate.

Preferably, the yttrium- or rare earth metal is yttrium, dysprosium, or erbium, in particular yttrium. Preferably, the alkaline earth metal is barium. Preferably, the transition metal is copper.

Preferably, the molar ratio of the transition metal-containing compound and yttrium or rare earth metal-containing compound in the ink is between 3:0.7 to 3:2, more preferably 3:1.2 to 3:1.4. Preferably, the molar ratio of the transition metal-containing compound and the earth alkaline metal-containing compound in the ink is between 3:1 to 3:2, more preferably 3:1.7 to 3:1.9.

The ink further contains an alcohol as described for the process above. Preferably, the alcohol is a mixture of methanol and $C_2$ to $C_{12}$ alcohols.

The ink contains the rare earth metal or yttrium containing compound, the alkaline earth metal containing compound and the transition metal containing compound in a molar ratio deemed optimal for the superconductor growth and/or properties, taking into consideration the molar composition of the respective metals in the superconductor to be produced. Their concentration thus depends on the superconductor to be produced. Generally, their concentration in the solution is independent of each other 0.01 to 10 mol/l, preferably 0.1 to 1 mol/l.

Preferably, the ink contains the nanoparticles at a concentration at which the molar ratio of metal in the nanoparticles to the yttrium or rare earth-containing compound is 1 to 30%, more preferably 3 to 20%, in particular 5 to 15%. In many cases this corresponds to 0.1 to 5 weight % of nanoparticles with regard to the ink.

Preferably the ink further contain stabilizers, wetting agents and/or other additives. The amount of these components may vary in the range of 0 up to 30 weight % relating to the total weight of the dry compounds used. Additives might be needed for adjusting the viscosity. Additives include Lewis bases; amines such as TEA (triethanolamine), DEA (diethanolamine); surfactant; polycarboxylic acids such as PMAA (polymetacrylic acid) and PAA (polyacrylic acid), PVP (poly-vinylpyrolidone), ethylcellulose.

Preferably the ink is heated and/or stirred to homogenize all ingredients, such as to reflux. In addition, the ink can further contain various additives to increase the stability of the solution and facilitate the deposition process. Examples for such additives include wetting agents, gelling agents, and antioxidants.

In order to make a superconductor with the ink according to the present invention, the ink is usually deposited on a substrate. The deposition of the ink can be carried out in various ways. The ink can be applied for example by dip-coating (dipping of the substrate in the ink), spin-coating (applying the ink to a rotating substrate), spray-coating (spraying or atomizing the ink on the substrate), capillary coating (applying the ink via a capillary), slot die coating (applying the ink through a narrow slit), and ink-jet printing. Slot die coating and ink-jet printing are preferred.

Preferably, the ink is evaporated after deposition to form a film at a temperature below the boiling point of the solvent, such as 10 to 100° C. below the boiling point of the solvent, preferably 20 to 50° C. below the boiling point of the solvent.

The substrate may be any material capable of supporting buffer and/or superconducting layers. For example suitable substrates are disclosed in EP 830 218, EP 1 208 244, EP 1 198 846, EP 2 137 330. Often, the substrate is a metal and/or alloy strip/tape, whereby the metal and/or alloy may be nickel, silver, copper, zinc, aluminum, iron, chromium, vanadium, palladium, molybdenum, tungsten and/or their alloys. Preferably the substrate is nickel based. More preferably, the substrate is nickel based and contains 1 to 10 at-%, in particular 3 to 9 at-%, tungsten. Laminated metal tapes, tapes coated with a second metal like galvanic coating or any other multi-material tape with a suitable surface can also be used as substrate.

The substrate is preferably textured, i.e. it has a textured surface. The substrates are typically 20 to 200 µm thick, preferably 40 to 100 µm. The length is typically greater than 1 m, the width is typically between 1 cm and 1 m.

Preferably the substrate surface is planarized before the film comprising yttrium or a rare earth metal, an alkaline earth metal and a transition metal is deposited onto, for example by electropolishing. It is often advantageous to subject the thus planarized substrate to a thermal treatment. This thermal treatment includes heating the substrate to 600 to 1000° C. for 2 to 15 minutes, wherein the time refers to the time during which the substrate is at the maximum temperature. Preferably, the thermal treatment is done under reducing atmosphere such as a hydrogen-containing atmosphere. The planarization and/or thermal treatment may be repeated.

Preferably, the surface of the substrate has a roughness with rms according to DIN EN ISO 4287 and 4288 of less than 15 nm. The roughness refers to an area of 10×10 μm within the boundaries of a crystallite grain of the substrate surface, so that the grain boundaries of the metal substrate do not influence the specified roughness measurement.

Preferably, between the substrate and the film there are one or more buffer layers. The buffer layer can contain any material capable of supporting the superconductor layer. Examples of buffer layer materials include metals and metal oxides, such as silver, nickel, $TbO_x$, $GaO_x$, $CeO_2$, yttria-stabilized zirconia (YSZ), $Y_2O_3$, $LaAlO_3$, $SrTiO_3$, $Gd_2O_3$, $LaNiO_3$, $LaCuO_3$, $SrRuO_3$, $NdGaO_3$, $NdAlO_3$ and/or some nitrides as known to those skilled in the art. Preferred buffer layer materials are yttrium-stabilized zirconium oxide (YSZ); various zirconates, such as gadolinium zirconate, lanthanum zirconate; titanates, such as strontium titanate; and simple oxides, such as cerium oxide, or magnesium oxide. More preferably the buffer layer contains lanthanum zirconate, cerium oxide, yttrium oxide, gadolinium-doped cerium oxide and/or strontium titanate. Even more preferably the buffer layer contains lanthanum zirconate and/or cerium oxide.

To enhance the degree of texture transfer and the efficiency as diffusion barrier, multiple buffer layers each containing a different buffer material are between the substrate and the film. Preferably the substrate includes two or three buffer layers, for example a first buffer layer comprising lanthanum zirconate and a second buffer layer containing cerium oxide.

The film is preferable heated to a temperature of 300 to 600° C., preferably 350 to 450° C. to remove remaining organic parts of the precursors. The substrate is kept at this temperature for 1 to 30 min, preferably 5 to 15 min.

Afterwards, the film is preferably heated to a temperature of 700 to 900° C., preferably 750 to 850° C. in an atmosphere containing water and oxygen to crystallize the film. The partial pressure of water is 1 to 99.5% of the total pressure of the atmosphere, and the partial pressure of oxygen is 0.5 to 90% of the total pressure of the atmosphere, preferably 2 to 90%. Even more preferably, during the first stage of heating to 700 to 900° C. the partial pressure of water is 1 to 20% of the total pressure of the atmosphere, preferably 1.5 to 5%, and during the second stage of this heating the partial pressure of water is 90 to 99.5% of the total pressure, preferably 95 to 99%.

Often, the superconductor wire is cut into smaller bands and stabilized by coating with a conductive metal such as copper for example by electrodeposition.

BRIEF DESCRIPTION OF THE FIGURES

FIG. 1 shows a SAXS measurement of stabilized $ZrO_2$ particles in an YBCO ink.

EXAMPLES

Example 1

Nanoparticle Synthesis

Example 1.1

$ZrO_2$ Nanoparticles 20 mmol (7.8 g) of zirconium(IV) isopropoxide propanol complex ($Zr[OCH(CH_3)_2]_4 \cdot (CH_3)_2CHOH$) and 25 mmol (5.83 g) of zirconium(IV) chloride were added to 100 g of purified and degassed trioctylphosphine oxide (TOPO, puri- fied by vacuum distillation) at 60° C. in an argon atmosphere. The temperature of the reaction mixture was raised slowly to 340° C. and held at this temperature for 2 h with vigorous stirring. During this thermal treatment, the initial light yellow solution changed to light green. The reaction mixture was then cooled to 60° C., and 500 ml of acetone was added to precipitate zirconia nanoparticles. The precipitate was retrieved by centrifugation and washed several times with acetone and redispersed in 110 ml toluene. The particle size of the nanoparticles measured by high resolution transmission electron microscopy was 2 to 3 nm. An XRD with peak assignment to crystal planes is depicted in FIG. 1.

Example 1.2

$HfO_2$ Nanoparticles

Under vigorous stirring, 0.5 ml of dibenzyl ether was added to 0.4 mmol of hafnium-IV-chloride in a 10 ml microwave vial. Then quickly 4 ml of benzyl alcohol was added, yielding a clear and colorless solution after 5 minutes of stirring. The solution was subjected to microwave heating with the following temperature settings: 5 minutes at 60° C. and 3 hours at 210° C. After synthesis the phase separated mixture was transferred to a plastic centrifugation tube and 3 ml of diethyl ether were added. After mild centrifugation (2000 rpm, 2 min) two clear and transparent phases were observed. The organic (top) phase was removed and ethanol was added to the aqueous (bottom) phase yielding 2 ml of a clear suspension. The particles were precipitated and washed once with diethyl ether. Finally the particles were redispersed in chloroform and typically 0.2 mmol of oleic acid was added to the milky suspension. Under stirring, oleylamine was added until a colorless and transparent suspension was obtained which is usually about 0.15 mmol (i.e., 50 μL). The particle size of the nanoparticles measured by high resolution transmission electron microscopy was 4 to 5 nm.

Example 2

To 1 ml of the $ZrO_2$ dispersion of example 1.1 7-8 ml acetone were added in a centrifuge vial. The $ZrO_2$ dispersion had a concentration of about 0.18 mol/l with regard to the zirconium. The precipitate was centrifuged for 15 min at 4000 rpm in a lab centrifuge. The supernatant solution was discarded. The precipitate was redispersed in 1 ml toluene, precipitated by adding 7-8 ml acetone and centrifuged. After the supernatant solution was discarded, 100 μl of a methanol solution containing compound Ia at a concentration of 350 g/l was added. Ia is a compound of general formula (I) in which a=0, b=6, c=5, n=2-3. The mixture was shaken in a lab shaking device for 2 min, whereupon a clear suspension formed. Then 900 μl of a methanol solution containing yttrium propionate (0.24 mol/l), barium trifluoroacetate (0.32 mol/l), and copper propionate (0.54 mol/l) was added (YBCO solution). The concentration of the YBCO solution is given as the concentration of the sum of yttrium, barium and copper in table 1.

Example 3

Ca. 15 mg of the organic compound given in table 1 were added to 100 μl of a nanoparticle dispersion in toluene at the concentration given in table 1. The mixture was shaken on a lab shaking device for 2 minutes to form a clear suspension. Then the toluene was removed by heating to 110-120° C. while decanol was added to replace the toluene. The obtained decanol solution was added to an YBCO solution as in example 2.

Example 4

The procedure according to example 2 is followed with the difference that instead of the compound Ia the compound IIa is used. Compound IIa is a compound of general formula (II) in which f=3, p=10, q=8.

Example 5

The procedure according to example 2 is followed with the difference that instead of the compound Ia the compound IIIa is used. Compound IIIa is a compound of general formula (III) in which e=0 and f=5-6.

Example 6 (Comparative Example) 100 μl of a nanoparticle dispersion in toluene was added to 900 μl of an YBCO solution described in example 2.

TABLE 1

Results from the examples.

| Example | Organic compound | | Nanoparticle | | YBCO solution | Obtained dispersion |
|---|---|---|---|---|---|---|
| | Type | Amount in mg | Oxide | c in mol/l | c in mol/l | |
| 2.1 | Ia | 35 | $ZrO_2$ | 0.18 | 1.10 | clear |
| 2.2 | Ia | 15 | $ZrO_2$ | 0.18 | 1.10 | clear |
| 2.3 | Ia | 35 | $ZrO_2$ | 0.18 | 1.10 | clear |
| 3.1 | Ia | 35 | $ZrO_2$ | 0.18 | 1.10 | clear |
| 3.2 | Ia | 35 | $ZrO_2$ | 0.18 | 1.10 | clear |
| 3.3 | Ia | 35 | $HfO_2$ | 0.08 | 1.10 | clear |
| 4.1 | IIa | 21 | $ZrO_2$ | 0.18 | 1.10 | clear |
| 4.2 | IIa | 21 | $HfO_2$ | 0.08 | 1.10 | clear |
| 5.1 | IIIa | 24 | $ZrO_2$ | 0.08 | 1.10 | clear |
| 5.2 | IIIa | 24 | $HfO_2$ | 0.08 | 1.10 | clear |
| 6.1 | Oleic acid | | $ZrO_2$ | 0.18 | 1.10 | precipitate |
| 6.2 | TOPO | | $HfO_2$ | 0.08 | 1.10 | precipitate |

The YBCO solution containing the stabilized particles according to example 1.1 were subjected to small angle X-ray scattering (SAXS). The result was analyzed via Guinier theory. A particle size of 2.1 nm was measured indicating that the nanoparticles are non-aggregated.

The invention claimed is:
1. Nanoparticles, comprising:
an oxide of at least one element selected from the group consisting of Sr, Ba, Y, La, Ti, Zr, Hf, Nb, and Ta, wherein:
the nanoparticles have a weight average diameter of 1 to 30 nm; and
an organic compound of general formula (I), (II) or (III) is on the surface of the nanoparticles:

(I)

(II)

(III)

wherein:
a is 0 to 5;
b and c are independent of each other 1 to 14;
n is 1 to 5;
r is 0 to 5;
p and q are independent of each other 1 to 14;
e is 0 to 12; and
f is 2 to 6.
2. The nanoparticles according to claim 1, wherein the nanoparticles comprise $ZrO_2$, $HfO_2$ or $Ta_2O_5$.
3. The nanoparticles according to claim 1, wherein a trialkyl phosphorous oxide or a fatty acid is additionally on the surface of the nanoparticles.
4. The nanoparticles according to claim 1, wherein the nanoparticles are crystalline.
5. The nanoparticles according to claim 1, wherein the nanoparticles have a dispersity of particle size distribution $D_{90}/D_{50}$ measured by dynamic light scattering of 1.2 or less.
6. A process for producing the nanoparticles of claim 1, the process comprising:
(i) precipitating nanoparticles comprising the oxide of at least one element selected from the group consisting of Sr, Ba, Y, La, Ti, Zr, Hf, Nb, and Ta from a suspension comprising a non-polar solvent, wherein the nanoparticles have a weight average diameter of 1 to 30 nm; and
(ii) adding an alcohol and the organic compound of general formula (I), (II) or (III) to the precipitated nanoparticles, to obtain the nanoparticles.
7. The process according to claim 6, wherein the suspension comprising a non-polar solvent and nanoparticles is produced by a condensation or esterification reaction comprising a soluble precursor in the presence of a surfactant.
8. An ink for the preparation of a high temperature superconductor, the ink comprising:
(a) an yttrium or rare earth metal-containing compound;
(b) an alkaline earth metal-containing compound;
(c) a transition metal-containing compound;
(d) an alcohol; and
(e) the nanoparticles of claim 1.
9. The ink according to claim 8, wherein the alcohol is a mixture of methanol and $C_2$ to $C_{12}$ alcohols.
10. The ink according to claim 8, wherein at least one of the rare earth metal-containing compound or the yttrium-containing compound, the alkaline earth metal-containing compound and the transition metal-containing compound contains fluorine.
11. The ink according to claim 8, comprising the nanoparticles at a concentration at which a molar ratio of metal in the nanoparticles to the yttrium-containing compound or the rare earth metal-containing compound is 1 to 30 %.

12. A superconductor, comprising the nanoparticles of claim 1 as pinning centers in the superconductors.

* * * * *

UNITED STATES PATENT AND TRADEMARK OFFICE
CERTIFICATE OF CORRECTION

PATENT NO. : 10,450,199 B2
APPLICATION NO. : 15/554742
DATED : October 22, 2019
INVENTOR(S) : Maximilian Hemgesberg et al.

Page 1 of 1

It is certified that error appears in the above-identified patent and that said Letters Patent is hereby corrected as shown below:

In the Specification

Column 2, Line 25, "(Ill)" should read -- (III) --,

Column 3, Line 51, "tartric" should read -- tartaric --,

Column 4, Line 63, "iodids;" should read -- iodides; --,

Column 4, Line 64, "propanolate," should read -- propanoate, --,

Column 4, Line 64, "butanolate," should read -- butanoate, --,

Column 4, Line 64, "hexanolat," should read -- hexanoate, --,

Column 6, Line 15, "(poly-vinylpyrolidone)," should read -- (poly-vinylpyrrolidone), --, Column 6, Line 15, "(poly-vinylpyrolidone)," should read -- (poly-vinylpyrrolidone), --, In the Claims Column 10, Line 58, Claim 9, "$C_{12}$," should read -- $C_{12}$ --.

Signed and Sealed this
Seventeenth Day of March, 2020

Andrei Iancu
*Director of the United States Patent and Trademark Office*